(12) United States Patent
Sakurai et al.

(10) Patent No.: US 8,772,176 B2
(45) Date of Patent: Jul. 8, 2014

(54) METHOD FOR FORMING AN ADHESIVE LAYER AND ADHESIVE COMPOSITION

(75) Inventors: Kazuyoshi Sakurai, Kawaguchi (JP); Yuichi Noguchi, Kawaguchi (JP); Norio Kurokawa, Kawaguchi (JP); Yasuo Tane, Yokkaichi (JP)

(73) Assignees: Kyocera Chemical Corporation, Kawaguchi-shi (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/048,397

(22) Filed: Mar. 15, 2011

(65) Prior Publication Data

US 2011/0263132 A1    Oct. 27, 2011

(30) Foreign Application Priority Data

Apr. 23, 2010    (JP) .................. 2010-099732

(51) Int. Cl.
    *H01L 21/30*    (2006.01)
(52) U.S. Cl.
    USPC ........................................ 438/758
(58) Field of Classification Search
    CPC ............ H01L 21/02274; H01L 21/02126; H01L 21/31612; H01L 21/02164
    USPC .................. 257/E21.211; 438/758
    See application file for complete search history.

(56) References Cited

U.S. PATENT DOCUMENTS

| | | | | |
|---|---|---|---|---|
| 5,698,152 | A * | 12/1997 | Taruno et al. | 264/272.11 |
| 6,514,560 | B2 * | 2/2003 | Paik et al. | 427/96.1 |
| 6,673,441 | B1 * | 1/2004 | Tanaka et al. | 428/355 EP |
| 7,341,642 | B2 * | 3/2008 | Kumakura | 156/273.5 |
| 7,694,415 | B2 * | 4/2010 | Honjo et al. | 29/841 |
| 2009/0133833 | A1 | 5/2009 | Honda et al. | |

FOREIGN PATENT DOCUMENTS

| | | |
|---|---|---|
| JP | 2005-20018 A | 1/2005 |
| JP | 2008-270282 | 11/2008 |
| JP | 2008-288571 | 11/2008 |
| WO | WO 2007/029504 A1 | 3/2007 |

OTHER PUBLICATIONS

Office Action issued Jan. 14, 2014 in Japanese Patent Application No. 2010-099732 with English language translation.

* cited by examiner

*Primary Examiner* — Matthew W Such
*Assistant Examiner* — Monica D Harrison
(74) *Attorney, Agent, or Firm* — Oblon, Spivak, McClelland, Maier & Neustadt, L.L.P.

(57) ABSTRACT

In a forming method of an adhesive layer including the steps of selectively coating, on a surface to be bonded, an adhesive composition containing a thermosetting composition and an organic solvent using a noncontact coating device; and removing the organic solvent from the adhesive composition coated on the surface to be bonded and in a forming method of an adhesive layer characterized in the thermosetting composition has a hardening property so as to exhibit two kinds of reaction temperatures, the adhesive composition comprising an epoxy resin and an epoxy curing agent which are reacted through a first hardening reaction exhibiting a first DSC peak within a temperature range of 100 to 160° C. and a second hardening reaction relating to a self-polymerization of the epoxy resin and exhibiting a second DSC peak within a temperature range of 140 to 200° C.

12 Claims, No Drawings

METHOD FOR FORMING AN ADHESIVE LAYER AND ADHESIVE COMPOSITION

CROSS-REFERENCE TO RELATED APPLICATION

This application is based upon and claims the benefit of priority from the prior Japanese Patent Application No. 2010-099732 filed on Apr. 23, 2010; the entire contents which are incorporated herein by reference.

BACKGROUND OF THE INVENTION

1. Field of the Invention

The present invention relates to a method for forming an adhesive layer suitable for forming the adhesive layer on a semiconductor element and to an adhesive composition to be used for the forming method.

2. Description of the Related Art

The formation of an adhesive layer on a surface to be adhered is conducted by forming an adhesive composition on the surface while the coating method of the adhesive composition is appropriately selected based on the kind of material, configuration of the surface and the kind of adhesive agent.

Recently, digital equipments and mobile devices using respective semiconductor elements are remarkably developed in function, downsizing and weight saving. The downsizing and weight saving of a semiconductor product to be used require the thinning of the semiconductor element to be packaged in addition to the thinning of the corresponding semiconductor package. As of now, the thinning of the semiconductor element is conducted by grinding the corresponding semiconductor wafer at the pre-step prior to cutting the semiconductor wafer into the corresponding semiconductor elements through dicing so as to satisfy the extreme thin element thickness of 100 μm or less, particularly several ten vim or less. Therefore, the thickness of the adhesive layer for adhering the semiconductor element to a conventional metallic frame or organic substrate affects remarkably on the thinning of the semiconductor product.

In the case of the formation of a liquid adhesive agent, conventionally, the coating of the adhesive agent is conducted by means of dispensing or stamping.

With the recent development in sophistication of the digital equipments, however, there are some technical problems in the aforementioned coating method of the adhesive composition when the packaging method where a plurality of semiconductor elements with the respective different functions are stacked or the multi layered stacking method for enhancing a memory capacitance is employed.

Namely, in the stacking structure and multi-stacking process of thin semiconductor elements, since each of the thin semiconductor elements is warped due to the thin thickness thereof, some voids are created at the adhesive layer interface or in the adhesive layer due to the incorporation of air in the adhering process of the semiconductor elements or the thermal compression bonding process of the semiconductor elements with adhesive agents thereon, resulting in the deterioration of production yield (refer to, e.g., References 1 and 2)

Fundamentally, in the dispensing method and stamping method, it is difficult to form the adhesive layer in a thickness of several μm so as to be extremely thinned and a coating amount is likely to be fluctuated, resulting in the technical difficulty of the uniform and stable formation of the adhesive layer.

In order to iron out these problems, a filmy adhesive sheet is developed and attributes largely to flash memories of which the capacities are being increased by means of multilayered process. The use of the filmy adhesive sheet cannot only control the thickness of the adhesive layer uniformly at the step of the film formation, but also form a restively thin adhesive layer. However, it is difficult to make the filmy adhesive sheet uniform in a thinner thickness of several μm so as to be used in the aforementioned extremely thinner elements and the handling of the filmy adhesive sheet of a thickness of several μm is not good and practical in the case of direct adhesion thereof on a silicon wafer or a semiconductor element. Moreover, there are various problems to be solved as the manufacture of such an extreme thinner filmy adhesive sheet requires much cost in comparison with a conventional one.

On the other hand, in the functional complex due to the stacking structure of a plurality of semiconductor elements and the large capacity due to the multilayered structure of a plurality of semiconductor elements in order to realize the multifunction of the semiconductor product, the adhesive technique for the semiconductor elements becomes important. In the adhering step of the semiconductor elements, the precision of adhering position is very important for the wire-bonding step and the flip-chip packaging step after the adhering step.

It is considered that the precision of adhering position is most subject to the precision of coating position of an adhesive agent to be coated. Inherently, it is required that the adhesive agent is coated highly precisely onto the adhering position as designed. As the coating method of the adhesive agent onto a lead frame, an organic substrate or a semiconductor element as a base to be coated can be considered a screen printing method. In this case, it is difficult to coat the adhesive agent so as to form the adhesive layer in a thickness of several μm or so and in the handling of the adhesive layer forming step, since some components such as a screen mesh or a squeegee are contacted with the forming surface of the adhesive layer, there is a problem that the substrate may be destroyed when the substrate is a thin silicon wafer, a chipped semiconductor element or the like.

[Reference 1] JP-A 2008-270282 (KOKAI)
[Reference 2] JP-A 2008-288571 (KOKAI)

BRIEF SUMMARY OF THE INVENTION

It is an object of the present invention to iron out the disadvantages in the forming method for various adhesive layers, that is, in the dispensing, the stamping, the filmy sheet, the screen printing and the like, and thus provide a method for forming an adhesive layer which can form a thinner adhesive layer stably.

It is also an object of the present invention to provide a thermosetting composition whereby in the thermal compression bonding of the semiconductor chip with an adhesive agent thereon, no void is created or voids are rendered to disappear or narrowed until the packaging process even though the voids may be created.

The inventors have intensely studied to achieve the objects and thus found out the following: Namely, in the thermally hardening process of an adhesive layer, if the coating process of an adhesive composition containing two hardening reactive composition, one having reactive property mainly at lower temperature and the other having reactive property mainly at higher temperature, and an organic solvent is conducted by a noncontact coating device with high coating precision, those problems can be solved so that the present invention have been conceived.

Namely, a method for forming an adhesive layer includes the steps of: selectively coating, on a surface to be bonded, an adhesive composition containing a thermosetting composition and an organic solvent using a noncontact coating device; and removing the organic solvent from the adhesive composition coated on the surface to be bonded, wherein the thermosetting composition has a hardening property so as to exhibit two kinds of reaction temperatures.

According to the forming method of adhesive layer, the disadvantages of the dispensing, the stamping, the filmy sheet, the screen printing and the like can be overcome so that the thinner adhesive layer can be formed. If the forming method is applied to some technical fields requiring the fine coating position precision such as electronic engineering field and a semiconductor industrial field, the intended adhesive layer can be formed so as to satisfy excellent properties such as advanced patterning property, adhesive force, heat-resistance, flatness of coating film, tack-free property at organic solvent-drying step or B-staging step, moisture-proof reliability and prevention of void creation which are required for industrial uses.

DETAILED DESCRIPTION OF THE INVENTION

First of all, the manufacturing process of a semiconductor device will be briefly described. Here, the manufacturing process includes a forming step of a circuit pattern on a surface of a wafer through resist coating, exposure, development, etching, resist removing; an inspecting step; a washing step; a thermally treating step; an impurity doping step; a diffusing step; and a flattening step, etc., which are classified in pre-steps in the manufacturing process. Moreover, the manufacturing process includes a fabricating step comprised of a coating step, a dicing step, a die bonding step, a wire bonding step, a sealing step and an inspecting step for inspecting the function and reliability of the semiconductor device, etc., which are classified in post-steps in the manufacturing process.

The adhesive layer according to the present invention is used as the adhesive composition of an adhesive agent which is to be utilized for stacking semiconductor elements in the die bonding step in the fabricating step of the semiconductor device.

First of all, the fabricating step of the semiconductor device using the adhesive layer of the present invention will be described. In the coating step, the adhesive composition is applied onto the rear surface (the surface opposite to the surface on which the circuit pattern is formed) of the semiconductor element (wafer) using a noncontact coating device.

As the noncontact coating device, a coating type device, an ink jet type device, a spraying type device, a mist coating type device, a roll coater type device, a screen printing type device, a jet dispensing type device and a squeegee type device can be exemplified. Preferably, the ink jet type coating device and the spraying type coating device are employed because a bonding agent can be applied in a state of film under the condition that the coating device is not contacted with the semiconductor element. More preferably, the ink jet type is employed because the thinner film can be formed uniformly. With the ink jet type coating device, the adhesive composition is discharged onto the rear surface of the semiconductor device from the discharging nozzle attached to the noncontact coating device to form a filmy adhesive layer.

In the B staging step, heat is applied from an oven or the like to render the adhesive layer formed on the rear surface of the semiconductor element in a state of semi-hardening (B stage). Due to the B stage step, if the adhesive layer is contacted with another member, the adhesive layer is not bonded with the member and thus can be maintained as it is.

In the dicing step, the wafer with the adhesive layer for the semiconductor elements is diced so as to form the chips including the semiconductor elements with the respective adhesive layers on the respective rear surfaces thereof. Instead, a predicting step may be conducted and the adhesive layers may be formed on the rear surfaces of the corresponding diced wafer chips so as to form the chips including the semiconductor elements with the respective adhesive layers on the respective rear surfaces thereof.

In the die bonding step, the semiconductor element is bonded with a base or another semiconductor element using the adhesive layer formed thereon. In the case of bonding the semiconductor element on the base via the adhesive layer, for example, the die bonding step is conducted by holding the base on the heated stage by means of vacuuming or by a collet and both of the semiconductor element and the base are heated and bonded one another.

In the wire bonding step, the electrodes disposed on the surface of the semiconductor element are connected with the electrodes formed on the surface of the base via the wires. The wire bonding step is conducted, e.g., by pressing the wire inserted into the capillary attached to the forefront of the bonding arm and bonding the wire to the electrodes one by one with the heat generated through supersonic vibration.

In the sealing step, the base and the semiconductor element are covered with an insulating resin. The sealing step is conducted, e.g., by disposing the base with the bonded semiconductor element or the pair of semiconductor elements bonded with one another in the cavity made by the fixed mold and the movable mold, injecting and charging the molten resin in the cavity, and pressing and heating the base with the bonded semiconductor element or the pair of semiconductor elements and the molten resin. In this way, the intended semiconductor device using the adhesive layer of the present invention can be manufactured.

Here, a thermal treatment may be conducted at the interval between the subsequent ones of the aforementioned steps for hardening the adhesive layer. For example, the thermal treatment may be conducted at the interval between the aforementioned mounting step and wire bonding step for the control of hardening using a furnace. As the furnace may be exemplified a cure furnace for conducting "Precure".

Then, the coating step and the like using the adhesive composition of the present invention will be described.
(Coating Step)

In the present invention, the adhesive composition made by dissolving the corresponding thermosetting composition in an organic solvent is configured so as to be formed on a predetermined position from the minute nozzle of the noncontact coating device when the adhesive composition is discharged from the noncontact coating device. In this point of view, the viscosity of the adhesive composition at 25° C. is preferably set within a range of 100 mPa·s or less and more preferably within a range of 5 to 50 mPa·s so that the nozzle clogging at the nozzle of the coating device can be suppressed. The viscosity of the adhesive composition can be control led by adjusting the amount of the organic solvent of the adhesive composition and the amount of the thermosetting composition.

Moreover, the content of the thermosetting composition of the adhesive composition is preferably set within a range of 5 to 50 mass %. If the content of the thermosetting composition is set to less than 5 mass %, the coating amount required for the formation of the adhesive layer with a desired thickness is increased and the drying period of time is also prolonged, resulting in the deterioration of the production yield of the adhesive layer. If the content of the thermosetting composition is set beyond 50 mass %, the viscosity of the solution cannot be sufficiently decreased, causing the clogging of the nozzle of the coating device.

Next, in the organic solvent removing step, the organic solvent contained in the adhesive composition formed on the surface to be coated in the coating step is removed to form the adhesive layer. Here, although the organic solvent is removed from the adhesive composition, the organic solvent can be easily dried and removed by thermal treatment because the organic solvent to be used in the present invention is volatile.

The heating means for drying and removing the organic solvent is not restricted only if the contained organic solvent can be effectively and efficiently removed from the adhesive composition. For example, such a heating device configured as heating the adhesive composition from the environment or heating the surface to be coated directly to volatilize the organic solvent may be exemplified. Alternatively, the organic solvent may be removed immediately after the coating of the adhesive composition by heating the wafer itself to form the adhesive layer effectively and efficiently.

(B Staging Step)

As described above, the organic solvent is removed from the adhesive composition to form the adhesive layer. In this case, since the adhesive layer is used for bonding the surface to be bonded and having the adhesive layer with another surface to be bonded, the adhesive layer is rendered in a state enough to exhibit the inherent function. Namely, in the drying step of the organic solvent and in the removing step of the organic solvent, it is required that the organic solvent is perfectly volatilized but the thermosetting component is not sufficiently hardened, that is, rendered in a state of B stage.

In the removing step of the organic solvent, the adhesive composition can be maintained in the state of B stage, based on the characteristics of the adhesive composition, generally by heating the adhesive composition within a temperature range of 40 to 120° C. for 1 to 180 minutes, thereby forming the semiconductor elements (chips) with the respective adhesive layer thereon.

(Die Bonding Step)

The semiconductor element with the adhesive layer thereon formed as described above is bonded in thermal compression with an organic substrate or an inorganic substrate, or another semiconductor element in the stacking step or the multi-stacking step. The temperature of the thermal compression bonding is preferably set within a range of 60 to 200° C. and more preferably set within a range of 70 to 180° C. If the temperature of the thermal compression bonding is set to less than 60° C., the wettability of the adhesive layer for the member to be bonded becomes insufficient and thus some voids may be created, resulting in the deterioration of moisture-proof reliability. If the temperature of the thermal compression bonding is set beyond 200° C., the resin viscosity of the adhesive layer is decreased, causing the shift in stacking position of the semiconductor elements and the side drop of the adhesive layer.

In the present invention, the adhesive composition is made from two compositions which are reacted at the respective different hardening temperatures. The epoxy resin and the epoxy curing agent are reacted at the lower hardening temperature and the epoxy resin is self-polymerized at the higher hardening temperature. The reactions at two hardening temperatures can be measured by a differential scanning calorimeter (DSC) and thus the reactive peak temperature at the lower hardening temperature is preferably separated from the reactive peak temperature at the higher hardening temperature by 10° C. or more.

The hardening reaction of the B-staged adhesive layer is originated from the thermosetting composition containing the epoxy resin having a differential scanning calorimetry (DSC) peak (lower hardening temperature peak), the epoxy curing agent and the curing accelerator, and much proceeds by more heating the stacking structure of the semiconductor elements with the respective adhesive layers thereon after forming the stacking structure so that the semiconductor element with the adhesive layer thereon can be tightly bonded in thermal compression with a lead frame, an organic substrate, or another semiconductor element.

(Wire Bonding Step)

In the wire bonding step for electrically connecting the electrodes disposed on the substrate, e.g., the organic substrate, with the electrodes disposed on the surface of the semiconductor element, it is required to advance the hardening of the adhesive composition in order to prevent the wire sweep. If the adhesive composition is not sufficiently hardened, the supersonic vibration is attenuated at the wire bonding step and thus some troubles such as the bonding failure and the lack of the bonding strength relating to the used bonding wires may occur.

Here, as the epoxy resin can be exemplified an epoxy resin containing two or more epoxy groups per one molecule such as a bisphenol A epoxy resin, bisphenol F epoxy resin, novolac epoxy resin, biphenyl epoxy resin, glycidyl ether epoxy resin, cycloaliphatic epoxy resin and heterocyclic epoxy resin.

As the epoxy curing agent can be exemplified a normal compound to be used for curing the epoxy resin so that the kind of epoxy curing agent is not restricted. For example, as an amine-based curing agent can be exemplified dicyandiamide and aromatic diamine and as a phenol-based curing agent can be exemplified phenol novolac resin, cresol novolac resin, bisphenol A novolac resin, triazine modified phenol novolac resin. Only one of the above-listed epoxy curing agents may be employed or two or more thereof may be employed in a state of combination. In view of heat-resistance and moisture-proof reliability, the phenol-based curing agent is preferably employed.

The compounding ratio of the epoxy resin and the phenol-based curing agent is preferably determined such that the equivalent ratio of the epoxy group equivalent of the epoxy resin to the hydroxyl group equivalent of the phenol-based curing agent falls within a range of 0.1 to 1.2 and preferably within a range of 0.3 to 1.0. If the equivalent ratio is less than 0.1, the hardening of the epoxy resin is not sufficient and if the equivalent ratio is beyond 1.2, the reactive property at the higher hardening temperature is diminished so that the equivalent ratio beyond 1.2 is not suitable for the disappearance and narrowing of void at the molding using a sealing agent.

As the curing accelerator can be exemplified a normal curing accelerator used in the cure of the epoxy resin. Concretely, an imidazole-based compound such as 2-ethyl-4-methylimidazole, 1-benzyl-2-methylimidazole and a tertiary amine-based compound such as boron trifluoride amine, triphenylphosphine (TPP), 1,8-diazabicyclo(5,4,0)undecene-7. Only one of the above-listed curing accelerator may be employed or two or more thereof may be employed in a state of combination.

The adhesive composition according to the present invention may contain an organic solvent, a silane coupling agent and a surface active agent, etc., as a constituent component.

The organic solvent is not restricted only if the thermosetting composition can be dissolved in the organic solvent. Preferably, the organic solvent has a boiling point of 120° C. or more so that the nozzle of the noncontact coating device for discharging the solution containing the adhesive composition cannot be clogged.

Concretely, as the organic solvent can be exemplified diglyme, propylene glycol monomethyl ether acetate, dipropylene glycol monomethyl ether, propylene glycol monoethyl ether acetate, 3-ethoxy propionic acid ethyl, γ-butyrolactone. Only one of the above-listed organic solvent may be employed or two or more thereof may be employed in a state of combination.

As the silane coupling agent can be exemplified epoxy-silane and acrylic-silane. Only one of the above-listed silane coupling agent may be employed or two or more thereof may be employed in a state of combination.

In the case of coating the adhesive composition onto a member to be bonded, a surface active agent may be employed so as to enhance the wettability of the adhesive composition. As the surface active agent can be exemplified silicone-based surface active agent, fluorine-based surface active agent and acryl-based surface active agent. Only one of the above-listed adhesive composition may be employed or two or more thereof may be employed in a state of combination.

On the other hand, the thermosetting composition has a DSC peak (higher hardening temperature peak) within a temperature range of 140 to 200° C. so that the hardening reaction of the thermosetting composition proceeds at the hardening step through the molding step after the semiconductor element is stacked on the organic substrate or another semiconductor element. Here, the temperature range relating to the lower hardening temperature peak is partially superimposed with the temperature range relating to the higher hardening temperature peak but in a normal thermosetting composition, the higher hardening temperature peak appears at a higher temperature than the lower hardening temperature peak.

The hardening reaction at a higher temperature is originated from a self-polymerization of the epoxy resin and is required to gradually proceed up to the final hardening stage. Namely, it is required that the epoxy resin is not perfectly hardened up to the final hardening stage. For example, the final hardening stage means the molding step using a sealing agent.

In the case that the epoxy resin is not perfectly hardened at the molding step, the adhesive layer is re-adhered by the holding pressure at the molding step, attributing the disappearance or narrowing of void even though some voids are created in the adhesive layer.

(Sealing Step (Molding Step))

The substrate and the semiconductor element which are electrically connected with one another are sealed with an insulating resin at the molding step, and hardened at a high temperature of about 180° C. In this case, the hardening of the adhesive agent of the semiconductor element with the adhesive agent thereon which is disposed or stacked in the corresponding semiconductor package much proceeds. In the molding step, since the substrate and the semiconductor element are heated again under the condition of pressing, the hardening reaction proceeds to render the voids to disappear or to be narrowed even though the voids are created at the interface of the adhesive layer or in the adhesive layer.

EXAMPLES

The present invention will be described in detail in reference to Examples.

Example 1

The adhesive composition was made the following: 100 parts by mass of an epoxy resin (j ER1001, made by Japan Epoxy Resins Co., Ltd.), 10 parts by mass of a phenol resin as an epoxy curing agent (BRG-556, made by SHOWA HIGH-POLYMER CO., LTD), 2 parts by mass of a silane coupling agent (KBM 403, made by Shin-Etsu Chemical Co., Ltd.), 0.2 part by mass of a curing accelerator (2E4MZ, made by SHIKOKU CHEMICALS CORPORATION), 1.5 parts by mass of another curing accelerator (U-CAT SA 102, made by SAN APRO LIMITED), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 12 mPa·s at 25° C. and a resin component of 22 parts by mass.

When the thermosetting composition of the adhesive composition was measured by the differential scanning calorimeter (model: EXATAR6000, rate of temperature rising: 10° C./minute, made by Seiko Instruments Inc.), the thermosetting composition exhibited two reaction peaks at 135° C. and 161° C., from which the difference in temperature of the reactive peaks at the higher hardening temperature and the lower hardening temperature was 26° C.

In order to selectively form a thin adhesive layer between the semiconductor element and the organic substrate, an ink jet device (piezo-type, diameter of nozzle=70 μmφ, nozzle distance=0.4 mm) was employed and a silicon wafer with a diameter of 200 mm and a thickness of 100 μm was set on a coating stage kept at 70° C. with the rear surface thereof up.

Then, the adhesive composition was coated using the ink jet device. After the coated wafer was dried at 90° C. for 60 minutes, the thickness of the coated adhesive composition was measured. As a result, it was turned out that the thickness of the coated adhesive composition was 9.8 μm. Then, the wafer with the coated adhesive composition was diced into chips with respective sizes of 10 mm×10 mm, and two chips were stacked on an organic substrate with a thickness of 0.3 mm and heated under the application of pressure of 2.0 N so as to harden the adhesive composition. During the hardening process, some voids are likely to be incorporated into the adhesive composition.

After hardening, the thus obtained stacking structure was sealed in a thickness of 0.8 mm with a sealing material (KE-G1250, made by KYOCERA Chemical Corporation), hardened at 175° C. for 8 hours and examined in reflow after absorption of moisture. The examined result was shown in Table 1. When the state of the thus obtained semiconductor package was observed by an ultrasonic imaging device (made by Hitachi Engineering & Service Co., Ltd.) after the reflow test was conducted at 260° C. after the moisture absorption treatment of JEDEC level 3, no void was recognized and no delamination was also recognized.

Example 2

The adhesive composition was made the following: 80 parts by mass of an epoxy resin (j ER1001, made by Japan Epoxy Resins Co., Ltd.), 20 parts by mass of another epoxy resin (ECON103S, made by NIPPON KAYAKU CO., LTD), 10 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 0.2 part by mass of a curing accelerator (1B2PZ, made by SHIKOKU CHEMICALS CORPORATION), 1.5 parts by mass of another curing accelerator (U-CAT SA 102, made by SAN APRO LIMITED), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 14 mPa·s at 25° C. and a resin component of 22 parts by mass.

The coating and evaluation of the adhesive composition were conducted in the same manner as in Example 1 except that the adhesive composition obtained in this Example was used instead of the adhesive composition obtained in Example 1.

Example 3

The adhesive composition was made the following: 100 parts by mass of an epoxy resin (j ER1001, made by Japan Epoxy Resins Co., Ltd.), 20 parts by mass of an epoxy curing agent (MEH-7800SS, made by MEIWA PLASTIC INDUSTRIES, LTD), 2 parts by mass of a silane coupling agent (KBM 403, made by Shin-Etsu Chemical Co., Ltd.), 0.2 part by mass of a curing accelerator (2E4MZ, made by SHIKOKU CHEMICALS CORPORATION), 1.0 part by mass of another curing accelerator (U-CAT SA1, made by SAN APRO LIMITED), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 18 mPa·s at 25° C. and a resin component of 24 parts by mass.

The coating and evaluation of the adhesive composition were conducted in the same manner as in Example 1 except that the adhesive composition obtained in this Example was used instead of the adhesive composition obtained in Example 1.

Example 4

The adhesive composition was made the following: 80 parts by mass of an epoxy resin (j ER1001, made by Japan Epoxy Resins Co., Ltd.), 20 parts by mass of another epoxy resin (EOCN103S, made by NIPPON KAYAKU CO., LTD), 15 parts by mass of an epoxy curing agent (MEH-7800SS, made by MEIWA PLASTIC INDUSTRIES, LTD), 2 parts by mass of a silane coupling agent (KBM 403, made by Shin-Etsu Chemical Co., Ltd.), 0.2 part by mass of a curing accelerator (1B2PZ, made by SHIKOKU CHEMICALS CORPORATION), 1.0 part by mass of another curing accelerator (U-CAT SA1, made by SAN APRO LIMITED), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 18 mPa·s at 25° C. and a resin component of 24 parts by mass.

The coating and evaluation of the adhesive composition were conducted in the same manner as in Example 1 except that the adhesive composition obtained in this Example was used instead of the adhesive composition obtained in Example 1.

Example 5

The adhesive composition was made the following: 100 parts by mass of an epoxy resin (j ER1001, made by Japan Epoxy Resins Co., Ltd.), 10 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 0.2 part by mass of a curing accelerator (1B2PZ, made by SHIKOKU CHEMICALS CORPORATION), 1.0 part by mass of triphenylphosphine (K−1 CHEMICAL INDUSTRY Co., LTD.), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 13 mPa·s at 25° C. and a resin component of 22 parts by mass.

The coating and evaluation of the adhesive composition were conducted in the same manner as in Example 1 except that the adhesive composition obtained in this Example was used instead of the adhesive composition obtained in Example 1.

Example 6

The adhesive composition was made the following: 40 parts by mass of an epoxy resin (j ER1001, made by Japan Epoxy Resins Co., Ltd.), 60 parts by mass of another epoxy resin (ECON103S, made by NIPPON KAYAKU CO., LTD), 15 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 0.2 part by mass of a curing accelerator (2E4MZ, made by SHIKOKU CHEMICALS CORPORATION), 1.0 part by mass of triphenylphosphine (K−1 CHEMICAL INDUSTRY Co., LTD.), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 11 mPa·s at 25° C. and a resin component of 24 parts by mass.

The coating and evaluation of the adhesive composition were conducted in the same manner as in Example 1 except that the adhesive composition obtained in this Example was used instead of the adhesive composition obtained in Example 1.

Example 7

The adhesive composition was made the following: 100 parts by mass of an epoxy resin (j ER1001, made by Japan Epoxy Resins Co., Ltd.), 20 parts by mass of an aromatic amine-based epoxy curing agent (CUA-4, made by IHARA CHEMICAL INDUSTRY CO., LTD), 2 parts by mass of a silane coupling agent (KBM 403, made by Shin-Etsu Chemical Co., Ltd.), 0.2 part by mass of a curing accelerator (2E4MZ, made by SHIKOKU CHEMICALS CORPORATION), 1.0 part by mass of triphenylphosphine (K−1 CHEMICAL INDUSTRY Co., LTD.), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 12 mPa·s at 25° C. and a resin component of 22 parts by mass.

The coating and evaluation of the adhesive composition were conducted in the same manner as in Example 1 except that the adhesive composition obtained in this Example was used instead of the adhesive composition obtained in Example 1.

Example 8

The adhesive composition was made the following: 100 parts by mass of an epoxy resin (jER1001, made by Japan Epoxy Resins Co., Ltd.), 10 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 0.2 part by mass of a curing accelerator (1B2PZ, made by SHIKOKU CHEMICALS CORPORATION), 3.0 parts by mass of AC4B50 (made by STELLA CHEMIFA CORPORATION), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 13 mPa·s at 25° C. and a resin component of 22 parts by mass.

The coating and evaluation of the adhesive composition were conducted in the same manner as in Example 1 except that the adhesive composition obtained in this Example was used instead of the adhesive composition obtained in Example 1.

Comparative Example 1

The adhesive composition was made the following: 100 parts by mass of an epoxy resin (jER1001, made by Japan Epoxy Resins Co., Ltd.), 20 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 1.0 part by mass of a curing accelerator (2E4MZ, made by SHIKOKU CHEMICALS CORPORATION), 0.2 part by mass of a surface active agent (BYK-302, made by BYK Additives & Instruments) and 400 parts by mass of a γ-butyrolactone as an organic solvent (GEL, made by MITSUBISHI CHEMICAL) were mixed and heated at 60° C. so as to be melted. The thus obtained adhesive composition had a viscosity of 16 mPa·s at 25° C. and a resin component of 26 parts by mass.

The coating and evaluation of the adhesive composition were conducted in the same manner as in Example 1 except that the adhesive composition obtained in this Example was used instead of the adhesive composition obtained in Example 1.

Comparative Example 2

The adhesive composition was made the following: 80 parts by mass of an epoxy resin (j ER1001, made by Japan Epoxy Resins Co., Ltd.), 20 parts by mass of another epoxy resin (EOCN103S, made by NIPPON KAYAKU CO., LTD), 40 parts by mass of a phenol resin as an epoxy curing agent (BRG-556, made by SHOWA HIGHPOLYMER CO., LTD), 2 parts by mass of a silane coupling agent (KBM 403, made by Shin-Etsu Chemical Co., Ltd.), 1.0 part by mass of a curing accelerator (1B2PZ, made by SHIKOKU CHEMICALS CORPORATION), 0.2 part by mass of a surface active agent (BYK-302, made by BYK Additives & Instruments) and 400 parts by mass of a γ-butyrolactone as an organic solvent (GBL, made by MITSUBISHI CHEMICAL) were mixed and heated at 60° C. so as to be melted. The thus obtained adhesive composition had a viscosity of 17 mPa·s at 25° C. and a resin component of 26 parts by mass.

The coating and evaluation of the adhesive composition were conducted in the same manner as in Example 1 except that the adhesive composition obtained in this Example was used instead of the adhesive composition obtained in Example 1.

TABLE 1

| | PRODUCT NAME | EXAMPLE 1 | EXAMPLE 2 | EXAMPLE 3 | EXAMPLE 4 | EXAMPLE 5 | EXAMPLE 6 | EXAMPLE 7 | EXAMPLE 8 | COMPARATIVE EXAMPLE 1 | COMPARATIVE EXAMPLE 2 |
|---|---|---|---|---|---|---|---|---|---|---|---|
| COMPOSITION BY MASS) EPOXY A | jER1001 | 100 | 80 | 100 | 80 | 100 | 40 | 100 | 100 | 100 | 80 |
| EPOXY B | EOCN103S | — | 20 | — | 20 | — | 60 | — | — | — | 20 |
| EPOXY CURING AGENT A | BRG-556 | 10 | 10 | 20 | — | 10 | 15 | — | 10 | 20 | 40 |
| EPOXY CURING AGENT B | MEH-7800SS | — | — | — | 15 | — | — | — | — | — | — |
| EPOXY CURING AGENT C | CUA-4 | — | — | — | — | — | — | 20 | — | — | — |
| CURING ACCELERATOR A | U-CAT-SA102 | 1.5 | 1.5 | — | — | — | — | — | — | — | — |
| CURING ACCELERATOR B | U-CAT-SA1 | — | — | 1 | 1 | 1 | 1 | 1 | — | — | — |
| CURING ACCELERATOR C | TPP | — | — | — | — | — | — | — | 3 | — | — |
| CURING ACCELERATOR D | AC4B50 | — | — | — | — | — | — | — | — | — | — |
| CURING ACCELERATOR E | 2E4MZ | 0.2 | 0.2 | 0.1 | 0.1 | 0.2 | 0.2 | 0.2 | 0.2 | 1 | 1 |
| | 1B2PZ | 2 | 2 | 2 | 2 | 2 | 2 | 2 | 2 | 2 | 2 |
| SILANE COUPLING AGENT | KBM403 | — | — | — | — | — | — | — | — | — | — |
| SURFACE ACTIVE AGENT | BYK-302 | 0.2 | 0.2 | 0.2 | 0.2 | 0.2 | 0.2 | 0.2 | 0.2 | 0.2 | 0.2 |
| ORGANIC SOLVENT | GBL | 400 | 400 | 400 | 400 | 400 | 400 | 400 | 400 | 400 | 400 |
| EVALUATION ITEMS DSC DIFFERENCE IN REACTION PEAK (°C) *1 | | 26 | 21 | 35 | 30 | 31 | 16 | 23 | 28 | 0 | 0 |
| COATING THICKNESS (um) *2 | | 9.8 | 10.1 | 10.9 | 10.1 | 10.3 | 11.1 | 10.5 | 9.9 | 11.5 | 11.8 |
| OCCURRENCE OF VOID AFTER STACKING *3 | | OCCURRENCE | NOT OCCURRENCE | NOT OCCURRENCE | NOT OCCURRENCE | NOT OCCURRENCE | NOT OCCURRENCE | NOT OCCURRENCE | NOT OCCURRENCE | OCCURRENCE | OCCURRENCE |
| OCCURRENCE OF VOID AFTER MOLDING *4 | | NOT OCCURRENCE | NOT OCCURRENCE | NOT OCCURRENCE | NOT OCCURRENCE | NOT OCCURRENCE | NOT OCCURRENCE | NOT OCCURRENCE | NOT OCCURRENCE | OCCURRENCE | OCCURRENCE |
| REFLOW RELIABILITY *5 | | NO DELAMINATION | NO DELAMINATION | NO DELAMINATION | NO DELAMINATION | NO DELAMINATION | NO DELAMINATION | NO DELAMINATION | NO DELAMINATION | DELAMINATION | DELAMINATION |

*1 Difference in DSC reaction peak: The reaction peaks of the thermosetting composition were measured with a differential scanning calorimetry (DSC) at a rate of temperature rise of 10° C./minute so that the difference in temperature between the lower temperature reaction peak and the higher temperature reaction peak was measured. In the case that the lower temperature reaction peak and the higher temperature reaction peak are not clarified, the difference in DSC reaction peak was defined as 0° C.
*2 Coating thickness: The step relating to the coating thickness was measured with Alpha-Step 500 (made by KLA-Tecnor Corporation)
*3 Occurrence of void after stacking: The state of the package was observed by an ultrasonic imaging device (made by Hitachi Engineering & Service Co., Ltd.) so as to examine the occurrence of void.
*4 Occurrence of void after molding: The state of the package was observed by an ultrasonic imaging device (made by Hitachi Engineering & Service Co., Ltd.) so as to examine the occurrence of void.
*5 Reflow reliability: The reflow test was conducted at 260° C. after the moisture absorption treatment of JEDEC level 3 to examine the occurrence of delamination by an ultrasonic imaging device (made by Hitachi Engineering & Service Co., Ltd.).

According to the present invention, the adhesive layer can be formed with satisfying advanced patterning property, flatness, moisture-proof reliability, thickness control, coating control, prevention of occurrence of void at hardening, low cost, tack-free property due to formation of solid adhesive layer which are required in electronic engineering field, a semiconductor industrial field, etc. Moreover, the adhesive composition can be provided which attributes to the disappearance or narrowing of void incorporated at a thermal compression bond for a semiconductor element with an adhesive agent thereon. Therefore, the present invention has excellent industrial availabilities.

If the forming method of the adhesive layer and the adhesive composition are employed, the thinner adhesive layer can be provided in a semiconductor chip stacking field, etc., which would use a conventional filmy adhesive agent. Moreover, since the adhesive composition can be applied onto a surface of a substrate or a surface layer in addition to a rear surface of semiconductor wafer, the degree of freedom in the fabrication of semiconductor can be enhanced.

What is claimed is:

1. A method of forming an adhesive layer on a wafer, comprising:
    selectively coating, on a surface of the wafer to be bonded, an adhesive composition containing a thermosetting composition, first and second kinds of hardening reactive compositions with respective first and second kinds of curing accelerators which are different from each other, the first hardening reactive composition having reactive property at a first temperature and the second hardening reactive composition having reactive property at a second temperature higher than the first temperature, and an organic solvent using a noncontact coating device; and
    removing the organic solvent from the adhesive composition coated on the surface to be bonded,
    wherein the thermosetting composition has a hardening property so as to exhibit two kinds of reaction temperatures.

2. The forming method according to claim 1,
    wherein the thermosetting composition has a lower temperature reaction peak and a higher temperature reaction peak in differential scanning calorimetry (DSC) which are related to the two kinds of reaction temperatures, and
    wherein the lower temperature reaction peak is separated from the higher temperature reaction peak by 10° C. or more.

3. The forming method as according to claim 2,
    wherein the thermosetting composition contains an epoxy resin, an epoxy curing agent, and the first and second kinds of curing accelerators.

4. The forming method according to claim 1,
    wherein the thermosetting composition contains an epoxy resin, an epoxy curing agent, and the first and second kinds of curing accelerators.

5. An adhesive composition to be employed in a forming method of an adhesive layer on a wafer comprising selectively coating, on a surface of the wafer to be bonded, an adhesive composition containing a thermosetting composition, first and second kinds of hardening reactive compositions, the first hardening reactive composition having reactive property at a first temperature and the second hardening reactive composition having reactive property at a second temperature higher than the first temperature, and an organic solvent using a noncontact coating device; and removing the organic solvent from the adhesive composition coated on the surface to be bonded,
    the adhesive composition comprising an epoxy resin, an epoxy curing agent, and a first curing accelerator which are reacted through a first hardening reaction exhibiting a first DSC peak within a first temperature range of 100 to 160° C., and a second hardening reaction relating to a self-polymerization of the epoxy resin and a second curing accelerator and exhibiting a second DSC peak within a second temperature range of 140 to 200° C.,
    wherein the first curing accelerator is different from the second curing accelerator.

6. The adhesive composition according to claim 5,
    wherein the adhesive composition is rendered in a state of B stage in the removing the solvent.

7. The adhesive composition according to claim 6,
    having a viscosity of 100 mPa·s or less and a content of the thermosetting composition within a range of 5 to 50 mass %.

8. The adhesive composition according to claim 5,
    having a viscosity of 100 mPa·s or less and a content of the thermosetting composition within a range of 5 to 50 mass %.

9. An adhesive composition to be employed in a forming method of an adhesive layer on a wafer,
    the adhesive composition containing a thermosetting composition, first and second kinds of hardening reactive compositions with respective first and second kinds of curing accelerators, the first hardening reactive composition having reactive property at a first temperature and the second hardening reactive composition having reactive property at a second temperature higher than the first temperature, and an organic solvent,
    wherein the thermosetting composition has a hardening property so as to exhibit two kinds of reaction temperatures
    wherein the first kind of curing accelerator is different from the second kind of curing accelerator.

10. The adhesive composition according to claim 9,
    wherein the thermosetting composition has a lower temperature reaction peak and a higher temperature reaction peak in differential scanning calorimetry (DSC) which are related to the two kinds of reaction temperatures, and
    wherein the lower temperature reaction peak is separated from the higher temperature reaction peak by 10° C. or more.

11. The adhesive composition according to claim 10,
    wherein the thermosetting composition contains an epoxy resin, an epoxy curing agent, and the first and second kinds of curing accelerators, which are different from each other.

12. The adhesive composition according to claim 9,
    wherein the thermosetting composition contains an epoxy resin, an epoxy curing agent, and the first and second kinds of curing accelerators, which are different from each other.

* * * * *